United States Patent
Masuda

(10) Patent No.: US 9,647,656 B2
(45) Date of Patent: May 9, 2017

(54) INTEGRATED CIRCUIT AND TRANSMISSION AND RECEPTION APPARATUS

(71) Applicant: FUJITSU LIMITED, Kawasaki-shi, Kanagawa (JP)

(72) Inventor: Satoshi Masuda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 158 days.

(21) Appl. No.: 14/568,169

(22) Filed: Dec. 12, 2014

(65) Prior Publication Data

US 2015/0200660 A1    Jul. 16, 2015

(30) Foreign Application Priority Data

Jan. 15, 2014 (JP) .................................. 2014-005177

(51) Int. Cl.
| | | |
|---|---|---|
| *H01P 1/20* | (2006.01) | |
| *H03F 3/04* | (2006.01) | |
| *H03K 17/16* | (2006.01) | |
| *H01L 23/66* | (2006.01) | |

(52) U.S. Cl.
CPC ............ *H03K 17/16* (2013.01); *H01L 23/66* (2013.01); *H01L 2223/665* (2013.01); *H01L 2223/6655* (2013.01); *H01L 2223/6683* (2013.01); *H01L 2224/06* (2013.01); *H01L 2924/0002* (2013.01)

(58) Field of Classification Search
CPC .......... H01L 2223/66; H01L 2223/664; H01L 2223/665; H01L 2223/6644; H01L 2223/6655
USPC .... 333/21, 204, 32, 338, 238; 330/286, 307, 330/66
See application file for complete search history.

(56) References Cited

U.S. PATENT DOCUMENTS

| | | | | |
|---|---|---|---|---|
| 4,320,353 A | * | 3/1982 | Sasaki ....................... | H03F 3/60 330/286 |
| 5,973,575 A | * | 10/1999 | Kamogawa .......... | H03B 5/1203 331/117 D |
| 6,259,332 B1 | * | 7/2001 | Hosoya ................ | H03B 5/1852 331/107 SL |

FOREIGN PATENT DOCUMENTS

| | | | |
|---|---|---|---|
| JP | 02076401 A | * | 3/1990 |
| JP | 11-307726 | | 11/1999 |
| JP | 2000-151221 | | 5/2000 |
| JP | 2001-148602 | | 5/2001 |

\* cited by examiner

*Primary Examiner* — Dinh T Le
(74) *Attorney, Agent, or Firm* — Fujitsu Patent Center

(57) ABSTRACT

An integrated circuit includes a transistor, and an impedance matching circuit coupled with the transistor. The impedance matching circuit includes a signal line to transmit a high-frequency signal and a power supply line that is a short stub branched from the signal line and supplies current to the transistor. The power supply line includes a bent line and a shortcut line to shortcut the bent line.

20 Claims, 13 Drawing Sheets

INTEGRATED CIRCUIT AND TRANSMISSION AND RECEPTION APPARATUS

CROSS-REFERENCE TO RELATED APPLICATION

This application is based upon and claims the benefit of priority of the prior Japanese Patent Application No. 2014-005177, filed on Jan. 15, 2014, the entire contents of which are incorporated herein by reference.

FIELD

The embodiments discussed herein are related to an integrated circuit and a transmission and reception apparatus.

BACKGROUND

With the development of the broadband in recent years, a request for high-speed wireless communication with a large capacity is increasing. Toward the increase of the capacity, an amplifier of the third generation for use with a transmission and reception apparatus provided, for example, in a base station of a portable telephone system has become widespread, and it is anticipated that the amplifier is hereafter developed to the fourth generation. Also a new communication system (LTE) has been placed into practical use, and it is anticipated that further increase of the capacity hereafter advances. Therefore, further increase of the output power and further enhancement of the efficiency are demanded for a transmission and reception apparatus provided in a base station.

Further, in a transmission and reception apparatus that is used, for example, in a radar (namely, in a transmission and reception module for a radar) and includes an amplifier, increase of the output power for the enhancement of a performance such as increase of the detection distance and enhancement of the resolution, increase of the bandwidth and increase of the efficiency for reduction of the operation cost and downsizing of a cooler are required.

SUMMARY

According to an aspect of the embodiment, an integrated circuit includes a transistor, and an impedance matching circuit coupled with the transistor, wherein the impedance matching circuit includes a signal line to transmit a high-frequency signal and a power supply line that is a short stub branched from the signal line and supplies current to the transistor, and the power supply line includes a bent line and a shortcut line to shortcut the bent line.

According to another aspect of the embodiment, a transmission and reception apparatus includes an amplifier that includes an integrated circuit including a transistor and an impedance matching circuit coupled with the transistor, wherein the impedance matching circuit includes a signal line to transmit a high-frequency signal and a power supply line that is a short stub branched from the signal line and supplies current to the transistor, and the power supply line includes a bent line and a shortcut line to shortcut the bent line.

The object and advantages of the disclosure will be realized and attained by means of the elements and combinations particularly pointed out in the claims.

It is to be understood that both the foregoing general description and the following detailed description are exemplary and explanatory and are not restrictive of the disclosure.

DESCRIPTION OF EMBODIMENTS

Incidentally, it seems recommendable to achieve, in order to implement increase of the output power and increase of the efficiency of the transmission and reception apparatus described above, increase of the output power and increase of the efficiency of an integrated circuit that is used for an amplifier provided in the transmission and reception apparatus.

To this end, it seems recommendable to use, for a transistor that is used for the integrated circuit, a high power transistor that can perform high current operation with a high voltage.

In this case, high current is supplied to the high power transistor.

However, since a power supply line for supplying current to a high power transistor is a line having a thickness of, for example, approximately several microns, the power supply line has a high resistance. Therefore, if high current is supplied through the power supply line, then a voltage drop is caused by the line resistance and sufficient power cannot be supplied to the high power transistor.

Therefore, even if the high power transistor is used, it is difficult to achieve increase of the output power and increase of the efficiency of the integrated circuit. Hence, it is difficult to implement increase of the output power and increase of the efficiency of the transmission and reception apparatus.

In this case, it seems recommendable to increase the line width of the power supply line to decrease the line resistance.

However, an impedance matching circuit is coupled with the high power transistor. Thus, where a short stub branched from a signal line included in the impedance matching circuit is used as a power supply line, if the line width of the short stub is increased, then the characteristic impedance of the transmission line decreases, resulting in failure to obtain a desired impedance matching characteristic.

Therefore, even if the line width of the power supply line is increased, it is difficult to achieve increase of the output power and increase of the efficiency of the integrated circuit. Hence, it is difficult to implement increase of the output power and increase of the efficiency of the transmission and reception apparatus.

It is to be noted that, while the subject described here is a subject in a case in which a high power transistor is used, the subject is not limited to this, and there is a similar subject also in a case in which current to be supplied to a transistor increases.

Therefore, it is desired to implement increase of the output power and increase of the efficiency of an integrated circuit and a transmission and reception apparatus.

In the following, an integrated circuit and a transmission and reception apparatus according to a present embodiment are described with reference to FIGS. 1 to 13.

Figure 1:
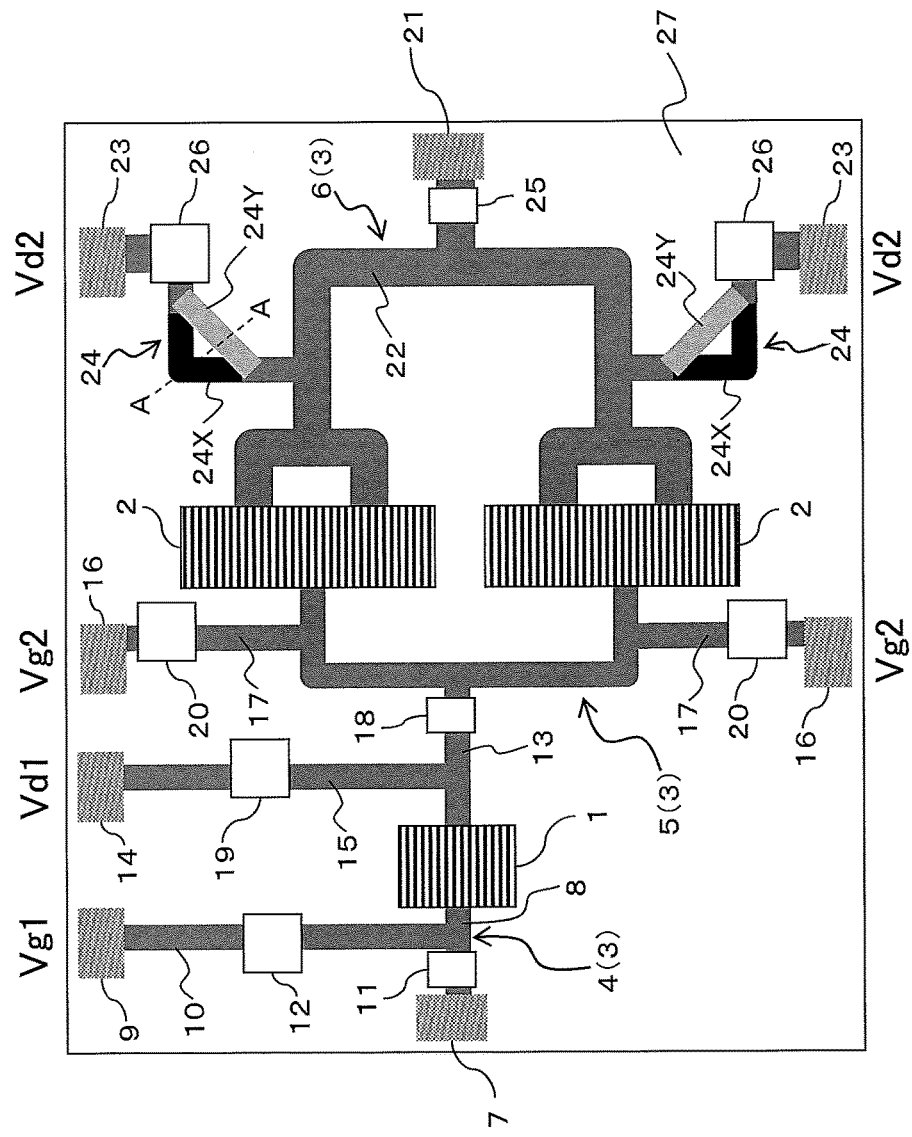
FIG. 1 is a schematic top plan view depicting a configuration of an integrated circuit according to an embodiment.

As depicted in FIG. 1, the integrated circuit according to the present embodiment includes transistors 1 and 2 and an impedance matching circuit 3 coupled with the transistors 1 and 2.

In the present embodiment, each of the transistors 1 and 2 is a high power transistor that can perform high current operation with a high voltage and, for example, a high electron mobility transistor (HEMT; GaN-HEMT) for which GaN or the like is used. Further, as the transistors, the first transistor 1 and the second transistors 2 (here, two) having a size greater than that of the first transistor 1 are provided. Thus, increase of the output power of the integrated circuit can be complemented by using the high power transistors 2 having an increased size and capable of performing high current operation with a high voltage in this manner.

Further, as the impedance matching circuit 3, an input matching circuit 4, an inter-stage matching circuit 5 and an output matching circuit 6 are provided.

Here, the input matching circuit 4 performs impedance matching between the impedance of an input terminal 7 and the input impedance of the first transistor 1. Here, the input matching circuit 4 includes a signal line 8 to couple the input terminal 7 and the first transistor 1 with each other and to transmit a high-frequency signal, a power supply line 10 to couple a power supply terminal 9 to which a voltage of Vg1 is applied and the first transistor 1 with each other, and capacitors 11 and 12 provided on the signal line 8 and the power supply line 10, respectively.

Further, the inter-stage matching circuit 5 performs impedance matching between the output impedance of the first transistor 1 at the preceding stage and the input impedance of the second transistor 2 at the succeeding stage. Here, the inter-stage matching circuit 5 includes a signal line 13 to couple the first transistor 1 at the preceding stage and the second transistors 2 at the following stage with each other and to transmit a high-frequency signal, a power supply line 15 to couple the power supply terminal 14 to which a voltage of Vd1 is applied and the first transistor 1 with each other, a power supply line 17 to couple a power supply terminal 16 to which a voltage of Vg2 is applied and the second transistors 2 with each other, and capacitors 18 to 20 provided on the signal line 13, power supply line 15 and power supply line 17, respectively.

Meanwhile, the output matching circuit 6 performs impedance matching between the output impedance of the second transistors 2 and the impedance of an output terminal 21. Here, the output matching circuit 6 includes a signal line 22 to couple the second transistors 2 and the output terminal 21 with each other and to transmit a high-frequency signal, power supply lines 24 to couple a power supply terminal 23 to which a voltage of Vd2 is applied and the second transistors 2 with each other, and capacitors 25 and 26 provided on the signal line 22 and the power supply lines 24, respectively.

Especially, in the present embodiment, the output matching circuit 6 that is an impedance matching circuit includes the signal line 22 to transmit a high-frequency signal, and the power supply lines 24 that are short stubs branched from the signal line 22 and supply current to the transistors. Here, the power supply lines 24 to supply current to the transistors are power supply lines to supply drain current to the second transistors 2 that are high power transistors having a large transistor size.

It is to be noted that, since the integrated circuit includes the high power transistors in this manner, the integrated circuit is referred to also as high power integrated circuit. Further, since the integrated circuit transmits a high-frequency signal, the integrated circuit is referred to also as high-frequency integrated circuit. Further, such an integrated circuit as just described is referred to also as high-frequency high power integrated circuit. Further, the power supply line is referred to also as power supplying line.

The transistors 1 and 2 and the impedance matching circuit 3 are integrated monolithically. Therefore, the integrated circuit is referred to also as monolithic integrated circuit.

In the present embodiment, the integrated circuit is an MMIC (Monolithic microwave integrated circuit) formed on a semiconductor substrate 27 [for example, SiC substrate; insulating semiconductor substrate (including a semi-insulating semiconductor substrate); insulating substrate] and having a GaN-HEMT. In particular, the integrated circuit is an device configured by integrating high power amplifiers (HPAs) having a GaN-HEMT to form an MMIC chip, namely, an HPA-MMIC chip.

Particularly, in the present embodiment, each power supply line 24 provided in the output matching circuit 6 that is an impedance matching circuit includes a bent line 24X (bend line) and a shortcut line 24Y to shortcut the bent line 24X.

Here, the bent line 24X has a bent shape. Here, the bent line 24X has a shape bent by approximately 90 degrees at one location thereof. Further, the bent line 24X is a metal line of, for example, gold.

The shortcut line 24Y is coupled with the bent line 24X so as to short-cut the bent line 24X. Here, the shortcut line 24Y is a line to couple one portion and the other portion across a bent portion of the bent line 24X so as to short-cut the bent portion of the bent line 24X having a shape bent by approximately 90 degrees at one location. Further, the shortcut line 24Y is a metal line of, for example, gold. Here, since the shortcut line 24Y functions substantially as a short stub as hereinafter described, the length of the shortcut line 24Y is set to a length with which the shortcut line 24Y can function as a short stub.

Figure 2:
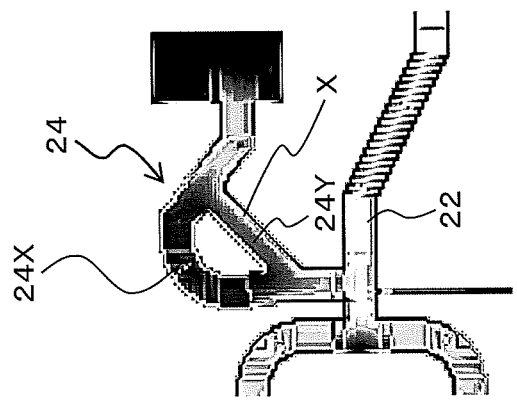
FIG. 2 is a view illustrating a result of a simulation of a high-frequency current distribution in an output matching circuit of the integrated circuit according to the present embodiment.

Here, FIG. 2 depicts a result of a simulation (result of an electromagnetic field simulation) of a high-frequency current distribution in the output matching circuit 6 of the integrated circuit including the power supply line 24 configured in such a manner as described above.

It is recognized that the current density of high-frequency current increases along one side of the shortcut line 24Y in the widthwise direction, namely, along the inner side of the bent power supply line 24 as indicated by reference character X in FIG. 2. In particular, the high-frequency current flows in a concentrated manner to the shortcut line 24Y while it little flows to the bent line 24X. Therefore, the high-frequency characteristic depends upon the shortcut line 24Y.

In this manner, the power supply line 24 is configured including the bent line 24X and the shortcut line 24Y to shortcut the bent line 24X such that a high-frequency signal transmitted through the signal line 22 is concentrated on the side of the shortcut line 24Y. As a result, only the shortcut line 24Y substantially functions as a short stub in the power supply line 24 including the bent line 24X and the shortcut line 24Y. Consequently, even if the power supply line 24 includes the bent line 24X and the shortcut line 24Y and the line width of the power supply line 24 is increased, decrease of the characteristic impedance of the transmission line can be reduced and failure in achievement of a desired impedance matching characteristic can be reduced.

On the other hand, since a high-frequency signal transmitted through the signal line 22 little flows to the side of the bent line 24X, the bent line 24X contributes principally to reduction of the resistance component that has an influence on direct current. In particular, since the direct current supplied from the power supply terminal 23 flows to both of the bent line 24X and the shortcut line 24Y, the line width of the power supply line 24 can be increased and the line resistance can be decreased. Therefore, even if a high power transistor having a large transistor size is used for the second transistors 2 as in the present embodiment and direct current to be supplied increases, sufficient power can be supplied to the second transistors 2.

By configuring the power supply line 24 so as to include the bent line 24X and the shortcut line 24Y in this manner, a desired impedance matching characteristic can be obtained while the line width of the power supply line 24 is increased to decrease the line resistance. Particularly, even if a high power transistor having a large transistor size is used for the second transistors 2 as in the present embodiment, sufficient power can be supplied to the second transistors 2 and increase of the output power and increase of the efficiency of the integrated circuit can be implemented. In particular, the integrated circuit that can achieve high output with a high efficiency with the resistance of the power supply line 24 decreased can be implemented without having an influence on the high-frequency characteristic (high-frequency matching circuit characteristic). In this manner, by contriving the structure of the power supply line 24 that serves as a short stub, enhancement of the high-frequency performance of the integrated circuit, namely, increase of the output power and increase of the efficiency of the integrated circuit, can be implemented. Further, since decrease of the characteristic impedance of a transmission line of the short stub can be reduced and a desired impedance matching characteristic can be obtained, design of a high-frequency circuit can be facilitated.

Further, by configuring the power supply line 24 so as to include the bent line 24X and the shortcut line 24Y to shortcut the bent line 24X, the area (chip area) of the integrated circuit can be reduced and also downsizing of the integrated circuit (downsizing of the chip) can be achieved.

Figure 3:
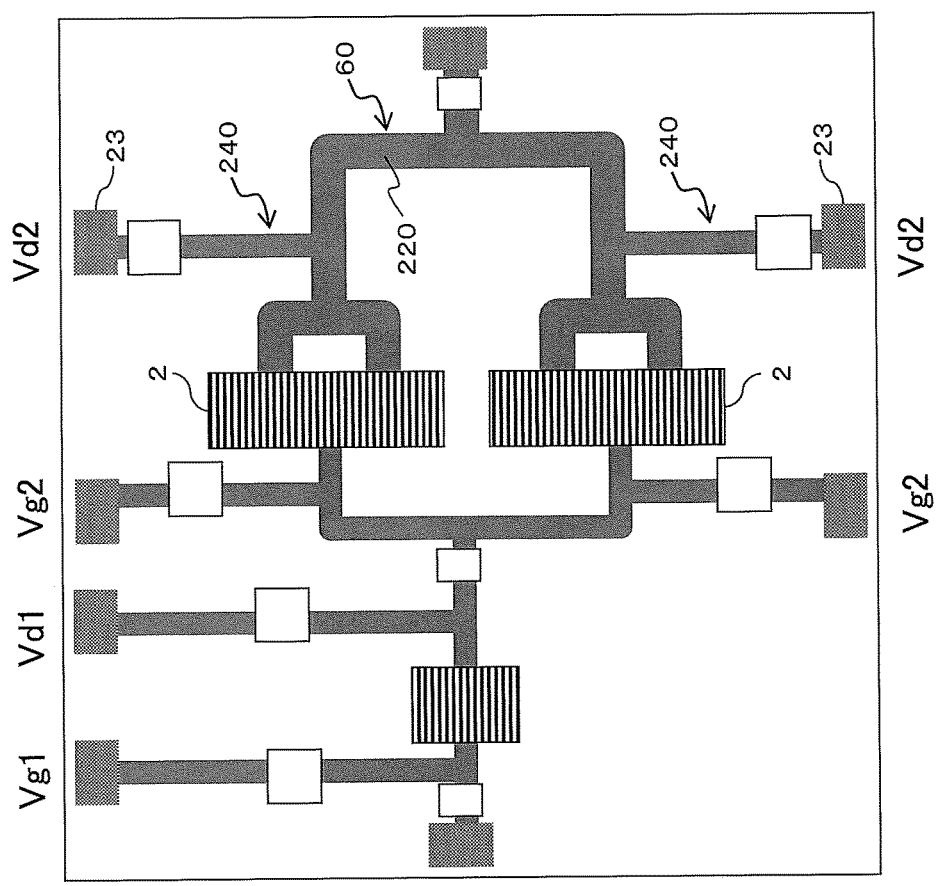
FIG. 3 is a schematic top plan view depicting a configuration of an integrated circuit of a comparative example.
Figure 4:
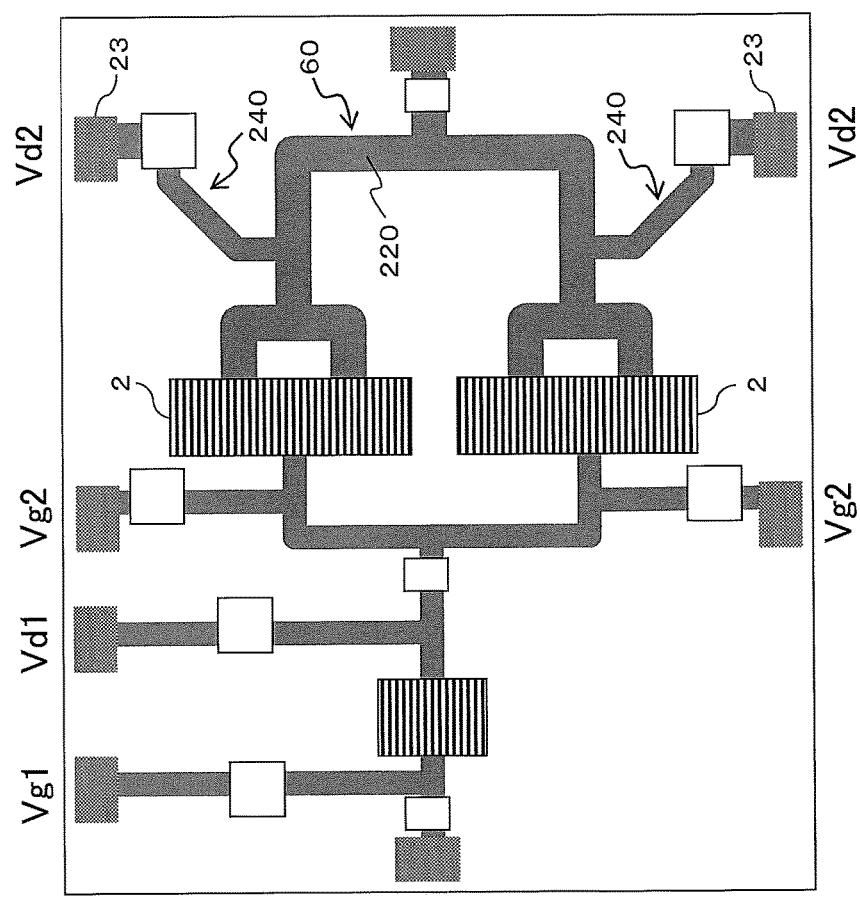
FIG. 4 is a schematic top plan view depicting a configuration of an integrated circuit of another comparative example.

On the other hand, if a line having a thickness of, for example, approximately several microns is provided as a power supply line 240 from the power supply terminal 23 (chip terminal) to each second transistor 2 that is a high power transistor having a large transistor size, for example, as depicted in FIGS. 3 and 4, and high current is supplied through the line, then since the line resistance is high and a voltage drop occurs, sufficient power cannot be supplied to the second transistor 2. Therefore, even if a high power transistor having a large transistor size is used for the second transistor 2, it is difficult to achieve increase of the output power and increase of the efficiency of the integrated circuit. In this case, it seems recommendable to increase the line width of the power supply line 240 to decrease the line resistance. However, where an output matching circuit 60 is coupled with the second transistor 2 that is a high power transistor having a large transistor size and a short stub branched from a signal line 220 included in the output matching circuit 60 is used as the power supply line 240, if the line width is increased, then the characteristic impedance of the transmission line decreases and a desired impedance matching characteristic cannot be obtained. Therefore, even if the line width of the power supply line 240 is increased, it is difficult to achieve increase of the output power and increase of the efficiency of the integrated circuit.

It is to be noted that, while, in the present embodiment, the power supply line 24 provided in the output matching circuit 6, namely, the power supply line 24 from the power supply terminal 23 to the second transistors 2 that are high power transistors having a large transistor size, includes the bent line 24X and the shortcut line 24Y to shortcut the bent line 24X, the power supply line 24 is not limited to this. For example, where current supplied to the power supply line 15 provided in the inter-stage matching circuit 5, namely, to the power supply line 15 (power supply line to supply drain current) from the power supply terminal 14 to the first transistor 1 that is a high power transistor whose transistor size is not large, increases or in a like case, the power supply line 15 may be configured so as to include a bent line and a shortcut line to shortcut the bent line. Or, where current supplied to the power supply line provided in the integrated circuit, namely, to the power supply line from the power supply terminal to the transistor, increases or a like case, the power supply line may be configured so as to include a bent line and a shortcut line to shortcut the bent line.

Incidentally, in the power supply line 24 including such a configuration as described above, it is preferable to set the effective dielectric constant (effective permittivity) of the shortcut line 24Y lower than that of the bent line 24X. It is to be noted that the effective dielectric constant is hereinafter referred to also as effective relative dielectric constant (effective relative permittivity).

Consequently, a high-frequency signal transmitted through the signal line 22 is more likely to be concentrated on the side of the shortcut line 24Y. As a result, in the power supply line 24 including the bent line 24X and the shortcut line 24Y, only the shortcut line 24Y substantially functions as a short stub. Consequently, even if the power supply line 24 includes the bent line 24X and the shortcut line 24Y and the line width of the power supply line 24 is substantially increased, decrease of the characteristic impedance of the transmission line can be reduced and failure in achievement of a desired impedance matching characteristic can be reduced. As a result, the integrated circuit of higher output power and a high efficiency can be implemented.

Figure 5A:
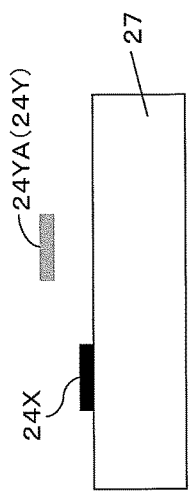
FIGS. 5A to 5D, 6A to 6D, 7A and 7B, 8A to 8D, 9A to 9D, 10A and 10B and 11A to 11D are schematic views depicting several examples of configuration of a power supply line portion provided in the output matching circuit of the integrated circuit according to the present embodiment, wherein they are sectional views taken along line A-A of FIG. 1.

For example, the integrated circuit may be configured such that the bent line 24X is formed on the semiconductor substrate 27 and the shortcut line 24Y includes an air bridge line 24YA as depicted in FIG. 5A. For example, the integrated circuit may be configured such that the shortcut line 24Y configured from the air bridge line 24YA is provided by coupling the air bridge line 24YA with the bent line 24X so that the bent line 24X formed on the semiconductor 27 is short-cut. The air bridge line 24YA, namely, the air bridge structure, can be fabricated by a semiconductor process.

For example, where an SiC substrate is used for the semiconductor substrate 27, the effective dielectric constant of the bent line 24X that configures a transmission line in cooperation with the ground at the substrate reverse face side is determined mainly based on a relative dielectric constant of approximately 10 of the SiC substrate 27. On the other hand, the effective dielectric constant of the shortcut line 24Y that configures a transmission line in cooperation with the ground at the substrate reverse face side is determined mainly based on a relative dielectric constant of approximately 1 of the air and a relative dielectric constant of approximately 10 of the SiC substrate 27. Consequently, the effective dielectric constant of the shortcut line 24Y and the effective dielectric constant of the bent line 24X are different from each other, and the effective dielectric constant of the shortcut line 24Y can be made lower than that of the bent line 24X. For example, the difference between the effective dielectric constant of the shortcut line 24Y and the effective dielectric constant of the bent line 24X can be secured great in comparison with that in a case in which an upper insulating film 28 and a lower insulating film 29 hereinafter described are provided.

Figure 5B:
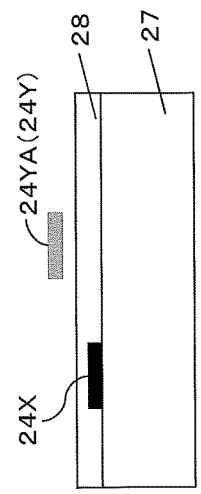

Further, an upper insulating film 28 to cover the bent line 24X may be provided as depicted in FIG. 5B. For example, the shortcut line 24Y including the air bridge line 24YA may be provided by covering the bent line 24X formed on the semiconductor substrate 27 with the upper insulating film 28 and coupling the air bridge line 24YA with the bent line 24X through a via so as to short-cut the bent line 24X.

Here, for the upper insulating film 28, for example, an SiN film, a polyimide film (organic insulating film) or the like is used. For example, a case in which an SiN film is provided as the upper insulating film 28, another case in which a polyimide film is provided as the upper insulating film 28 and a further case in which an SiN film and a polyimide film are provided as the upper insulating film 28 are available.

For example, where an SiC substrate is used as the semiconductor substrate 27 and the upper insulating film 28 is provided, the effective dielectric constant of the bent line 24X configuring the transmission line in cooperation with the ground at the substrate reverse face side is determined mainly based on a relative dielectric constant of approximately 10 of the SiC substrate 27. On the other hand, the effective dielectric constant of the shortcut line 24Y configuring the transmission line in cooperation with the ground at the substrate reverse face side is determined mainly based on the relative dielectric constant of approximately 1 of the air, the relative dielectric constant of the upper insulating film 28 (for example, where an SiN film is provided, the relative dielectric constant is approximately 7.5; for example, where a polyimide film is provided, the relative dielectric constant is approximately 3.5; and, for example, where an SiN film and a polyimide film are provided, the relative dielectric constants of the films are approximately 7.5 and approximately 3.5, respectively) and the relative dielectric constant of approximately 10 of the SiC substrate 27. Consequently, the effective dielectric constant of the shortcut line 24Y and the effective dielectric constant of the bent line 24X are different from each other, and the effective dielectric constant of the shortcut line 24Y can be made lower than that of the bent line 24X.

Figure 5C:
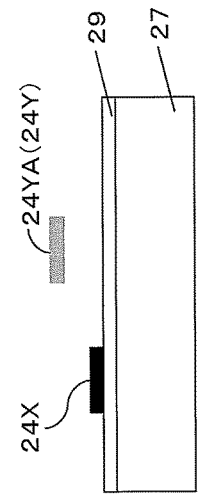

Further, the integrated circuit may be configured such that a lower insulating film 29 is provided on the semiconductor substrate 27 and the bent line 24X is formed on the lower insulating film 29 as depicted in FIG. 5C. In particular, the integrated circuit may be configured such that the bent line 24X is formed on the lower insulating film 29 and the shortcut line 24Y includes the air bridge line 24YA. Here, the lower insulating film 29 is, for example, an SiN film or the like.

For example, where an SiC substrate is used as the semiconductor substrate 27 and an SiN film is provided as the lower insulating film 29 on the semiconductor substrate 27, the effective dielectric constant of the bent line 24X configuring the transmission line in cooperation with the ground at the substrate reverse face side is determined mainly based on the relative dielectric constant of approximately 7.5 of the SiC film 29 and the relative dielectric constant of approximately 10 of the SiC substrate 27. On the other hand, the effective dielectric constant of the shortcut line 24Y configuring the transmission line in cooperation with the ground at the substrate reverse face side is determined mainly based on the relative dielectric constant of approximately 1 of the air, the relative dielectric constant of approximately 7.5 of the SiC film 29 and the relative dielectric constant of approximately 10 of the SiC substrate 27. Consequently, the effective dielectric constant of the shortcut line 24Y and the effective dielectric constant of the bent line 24X are different from each other, and the effective dielectric constant of the shortcut line 24Y can be made lower than that of the bent line 24X.

Figure 5D:
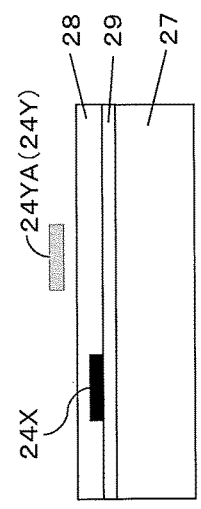

Further, as depicted in FIG. 5D, the integrated circuit in this example may be configured such that the lower insulating film 29 is provided on the semiconductor substrate 27 and the bent line 24X is formed on the lower insulating film 29 and besides the upper insulating film 28 to cover the bent line 24X is provided. In particular, the integrated circuit may be configured such that the bent line 24X is formed on the lower insulating film 29 and the upper insulating film 28 to cover the bent line 24X is provided and besides the shortcut line 24Y includes the air bridge line 24YA. Here, the lower insulating film 29 is, for example, an SiN film or the like.

For example, where an SiC substrate is used as the semiconductor substrate 27 and an SiN film is provided as the lower insulating film 29 on the semiconductor substrate 27 and besides the upper insulating film 28 is provided, the effective dielectric constant of the bent line 24X configuring the transmission line in cooperation with the ground at the substrate reverse face side is determined mainly based on the relative dielectric constant of approximately 7.5 of the SiN film 29 and the relative dielectric constant of approximately 10 of the SiC substrate 27. On the other hand, where the effective dielectric constant of the shortcut line 24Y configuring the transmission line in cooperation with the ground at the substrate reverse face side is determined mainly based on the relative dielectric constant of approximately 1 of the air, relative dielectric constant of the upper insulating film 28 (for example, where an SiN film is provided, the relative dielectric constant is approximately 7.5; for example, where a polyimide film is provided, the relative dielectric constant is approximately 3.5; and, for example, where an SiN film and a polyimide film are provided, the relative dielectric constants of the films are approximately 7.5 and approximately 3.5, respectively), relative dielectric constant of approximately 7.5 of the SiN film and relative dielectric constant of approximately 10 of the SiC substrate 27. Consequently, the effective dielectric constant of the shortcut line 24Y and the effective dielectric constant of the bent line 24X are different from each other, and the effective dielectric constant of the shortcut line 24Y can be made lower than that in the bent line 24X.

Figure 6A:
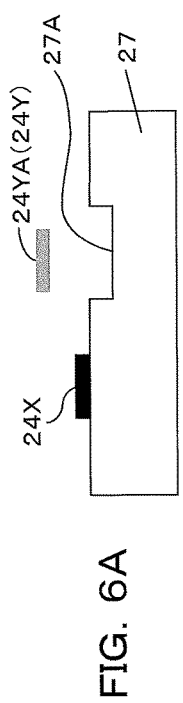

Further, the thickness of the semiconductor substrate 27 may be smaller at a portion thereof under the shortcut line 24Y (here, air bridge line 24YA) than at the other portion as depicted in FIG. 6A. For example, a groove 27A (ditch) may be provided on the surface of the semiconductor substrate 27 just under the shortcut line 24Y. Consequently, it is possible to decrease the semiconductor substrate 27 just under the shortcut line 24Y that has an influence on the effective dielectric constant of the shortcut line 24Y and increase the air, namely, increase the distance between the shortcut line 24Y and the semiconductor substrate 27 to increase the air having a low relative dielectric constant. Therefore, in comparison with an alternative case in which the groove 27A is not provided on such a semiconductor substrate 27 as just described, the effective dielectric constant of the shortcut line 24Y can be decreased further. In other words, the difference between the effective dielectric constant of the shortcut line 24Y and the effective dielectric constant of the bent line 24X can be secured greater.

Figure 6B:
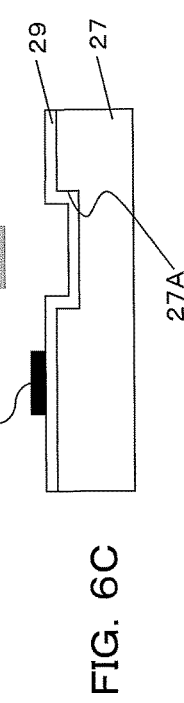

Also in this case, the upper insulating film 28 to cover the bent line 24X may be provided as depicted in FIG. 6B. In particular, the integrated circuit may be configured such that the upper insulating film 28 to cover the bent line 24X is provided and the thickness of the semiconductor substrate 27 is smaller at a portion thereof under the shortcut line 24Y (here, the air bridge line 24YA) than at the other portion thereof. For example, the integrated circuit may be configured such that the bent line 24X formed on the semiconductor substrate 27 having the groove 27A and the groove 27A are covered with the upper insulating film 28, and the air bridge line 24YA is coupled with the bent line 24X through a via so as to short-cut the bent line 24X so that the shortcut line 24Y (here, the air bridge line 24YA) is provided over the groove 27A provided on the semiconductor substrate 27 and buried by the upper insulating film 28. Here, for the upper insulating film 28, for example, an SiN film, a polyimide film (organic insulating film) or the like is used. For example, a case in which an SiN film is provided as the upper insulating film 28, another case in which a polyimide film is provided and a further case in which an SiN film and a polyimide film are provided are available. Consequently, it is possible to decrease the semiconductor substrate 27 just under the shortcut line 24Y that has an influence on the effective dielectric constant of the shortcut line 24Y and increase the upper insulating film 28 having a lower relative dielectric constant than that of the semiconductor substrate 27. Therefore, in comparison with an alternative case in which such a groove 27A as described above is not provided, the effective dielectric constant of the shortcut line 24Y can be decreased further. In other words, the difference between the effective dielectric constant of the shortcut line 24Y and the effective dielectric constant of the bent line 24X can be secured greater.

Figure 6C:
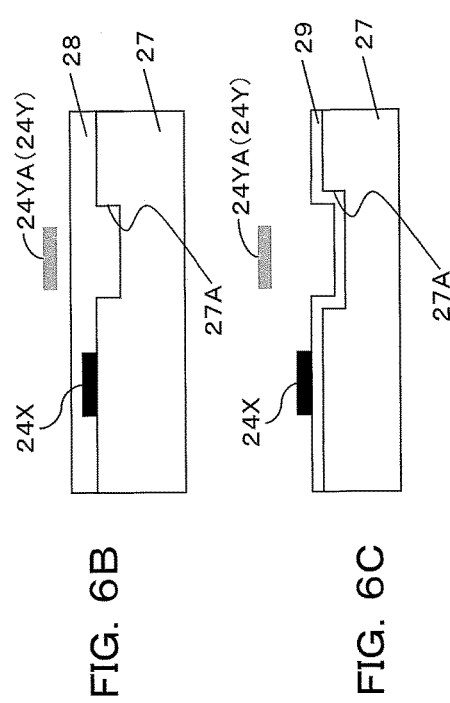

Further, the integrated circuit may be configured such that the lower insulating film 29 is provided on the semiconductor substrate 27 having the groove 27A and the bent line 24X is formed on the lower insulating film 29 as depicted in FIG. 6C. In particular, the integrated circuit may be configured such that the bent line 24X is formed on the lower insulating film 29 and the shortcut line 24Y is configured including the air bridge line 24YA and besides the shortcut line 24Y (here, the air bridge line 24YA) is provided over the groove 27A provided on the semiconductor substrate 27. In this manner, the integrated circuit may be configured such that the lower insulating film 29 is provided on the semiconductor substrate 27 and the bent line 24X is formed on the lower insulating film 29 and besides the thickness of the semiconductor substrate 27 is smaller at a portion thereof under the shortcut line 24Y (here, the air bridge line 24YA) than at the other portion thereof. Here, the lower insulating film 29 is, for example, an SiN film or the like.

Figure 6D:
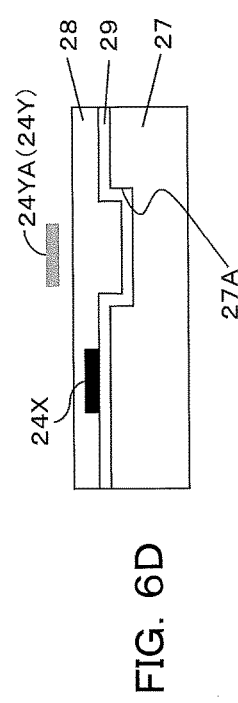
Figure 7A:
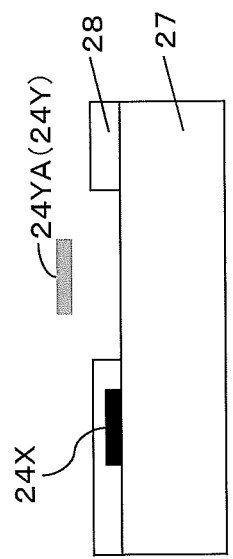

Further, as depicted in FIG. 6D, the integrated circuit may be configured such that the lower insulating film 29 is provided on the semiconductor substrate 27 having the groove 27A, the bent line 24X is formed on the lower insulating film 29, and the upper insulating film 28 to cover the bent line 24X is provided. In particular, the integrated circuit may be configured such that the bent line 24X is formed on the lower insulating film 29 and the upper insulating film 28 to cover the bent line 24X is provided while the shortcut line 24Y includes the air bridge line 24YA and the shortcut line 24Y (here, the air bridge line 24YA) is provided over the groove 27A provided on the semiconductor substrate 27. In this manner, the integrated circuit may be configured such that the lower insulating film 29 is provided on the semiconductor substrate 27 and the bent line 24X is formed on the lower insulating film 29 while the upper insulating film 28 to cover the bent line 24X is provided and the thickness of the semiconductor substrate 27 is smaller at a portion thereof under the shortcut line 24Y (here, the air bridge line 24YA) than at the other portion thereof. Here, the lower insulating film 29 is, for example, an SiN film or the like.

Where the upper insulating film 28 to cover the bent line 24X is provided, the thickness of the upper insulating film 28 may be smaller at a portion thereof under the shortcut line 24Y (here, air bridge line 24YA) than at the other portion thereof. For example, the upper insulating film 28 may be removed in the form of a groove at a portion thereof just under the shortcut line 24Y (here, the air bridge line 24YA), or a groove (ditch) may be provided on the surface of the upper insulating film 28 just under the shortcut line 24Y (here, the air bridge line 24YA) as depicted in FIG. 7A. Consequently, the upper insulating film 28 just under the shortcut line 24Y that has an influence on the effective dielectric constant of the shortcut line 24Y can be reduced and the air having a lower relative dielectric constant can be increased. Therefore, in comparison with an alternative case in which the upper insulating film 28 is not removed in the form of a groove or a groove is not provided, the effective dielectric constant of the shortcut line 24Y can be decreased further. In other words, the difference between the effective dielectric constant of the shortcut line 24Y and the effective dielectric constant of the bent line 24X can be secured greater.

Figure 7B:
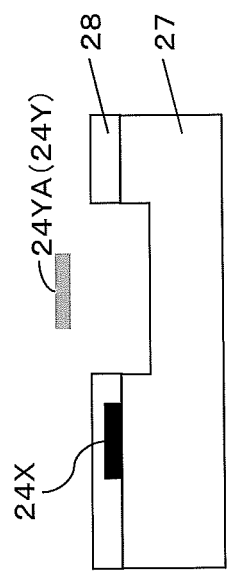

In this case, the thickness of the semiconductor substrate 27 may be smaller at a portion thereof under the shortcut line 24Y (here, the air bridge line 24YA) than at the other portion thereof as depicted in FIG. 7B. Further, the lower insulating film 29 may be provided on the semiconductor substrate 27 similarly as in the case described above. Further, the thickness of the lower insulating film 29 may be smaller at a portion thereof under the shortcut line 24Y (here, the air bridge line 24YA) than at the other portion thereof. In particular, the lower insulating film 29 just under the shortcut line 24Y (here, the air bridge line 24YA) may be removed in the form of a groove, or a groove (ditch) may be provided on the surface of the lower insulating film 29 just under the shortcut line 24Y (here, the air bridge line 24YA).

Further, the shortcut line 24Y may include a wire (bonding wire) 24YB in place of the air bridge line 24YA.

Figure 8A:
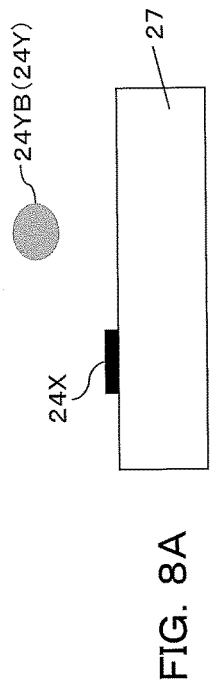

In particular, the bent line 24X may be formed on the semiconductor substrate 27 and the shortcut line 24Y may include the wire 24YB as depicted in FIG. 8A. For example, the shortcut line 24Y configured from the wire 24YB may be provided by coupling the wire 24YB with the bent line 24X so as to short-cut the bent line 24X formed on the semiconductor substrate 27.

Figure 8B:
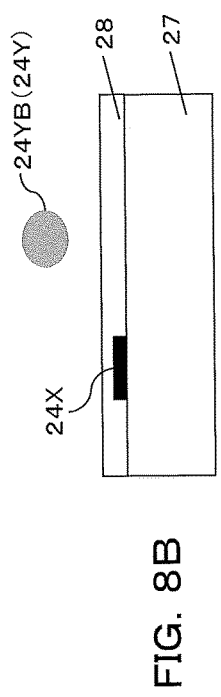

Further, the upper insulating film 28 to cover the bent line 24X may be provided as depicted in FIG. 8B. For example, the shortcut line 24Y including wire 24YB may be provided by covering the bent line 24X formed on the semiconductor substrate 27 with the upper insulating film 28 and coupling the wire 24YB with the bent line 24X through a via so as to short-cut the bent line 24X.

Figure 8C:
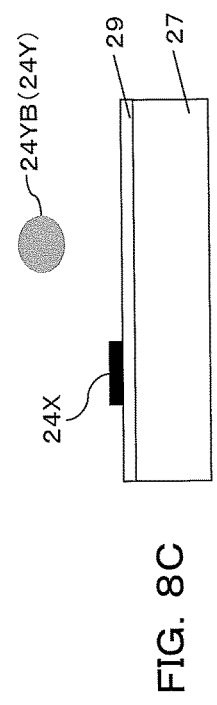

Further, the lower insulating film 29 may be provided on the semiconductor substrate 27 and the bent line 24X may be formed on the lower insulating film 29 as depicted in FIG. 8C. In other words, the bent line 24X may be formed on the lower insulating film 29 and the shortcut line 24Y may include wire 24YB.

Figure 8D:
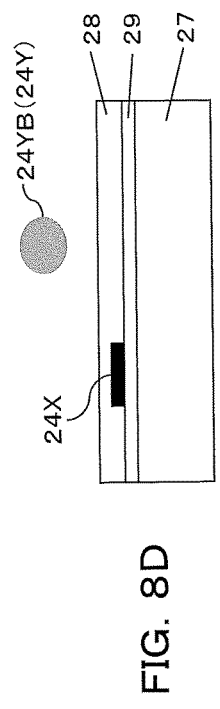

Further, the integrated circuit may be configured such that the lower insulating film 29 is provided on the semiconductor substrate 27 and the bent line 24X is formed on the lower insulating film 29 and besides the upper insulating film 28 to cover the bent line 24X is provided as depicted in FIG. 8D. In other words, the integrated circuit may be configured such that the bent line 24X is formed on the lower insulating film 29 and the shortcut line 24Y includes the wire 24YB and besides the upper insulating film 28 to cover the bent line 24X is provided.

Figure 9A:
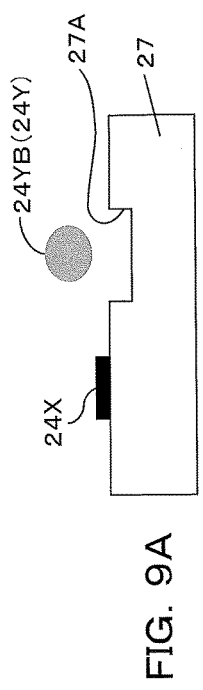

Further, as depicted in FIG. 9A, the thickness of the semiconductor substrate 27 may be smaller at a portion thereof under the shortcut line 24Y (here, the wire 24YB) than at the other portion thereof. For example, the groove 27A (ditch) may be provided on the surface of the semiconductor substrate 27 just under the shortcut line 24Y.

Figure 9B:
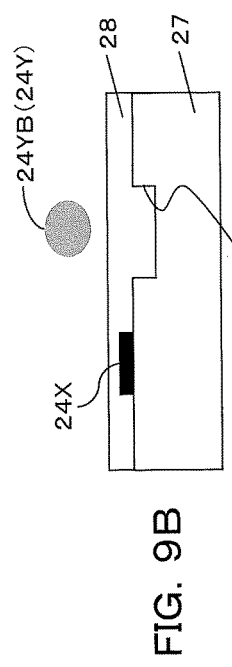

Also in this case, the upper insulating film 28 to cover the bent line 24X may be provided as depicted in FIG. 9B. In particular, the integrated circuit may be configured such that the upper insulating film 28 to cover the bent line 24X is provided and the thickness of the semiconductor substrate 27 is smaller at a portion thereof under the shortcut line 24Y (here, the wire 24YB) than at the other portion thereof. The shortcut line 24Y (here, the wire 24YB) may be provided over the groove 27A provided on the semiconductor substrate 27 and buried by the upper insulating film 28, for example, by covering the bent line 24X formed on the semiconductor substrate 27 having the groove 27A and the groove 27A with the upper insulating film 28 and coupling the wire 24YB with the bent line 24X through a via so as to short-cut the bent line 24X.

Figure 9C:
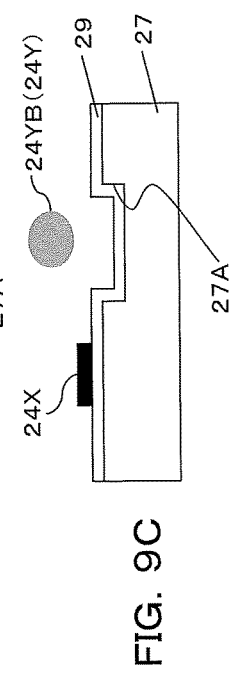

Further, the lower insulating film 29 may be provided on the semiconductor substrate 27 having the groove 27A and the bent line 24X may be formed on the lower insulating film 29 as depicted in FIG. 9C. In particular, the integrated circuit may be configured such that the bent line 24X is formed on the lower insulating film 29 and the shortcut line 24Y includes the wire 24YB and besides the shortcut line 27Y (here, the wire 27YB) is provided over the groove 27A provided on the semiconductor substrate 27. In this manner, the integrated circuit may be configured such that the lower insulating film 29 is provided on the semiconductor substrate 27 and the bent line 24X is formed on the lower insulating film 29 and besides the thickness of the semiconductor substrate 27 is smaller at a portion thereof under the shortcut line 24Y (here, the wire 24YB) than at the other portion thereof.

Figure 9D:
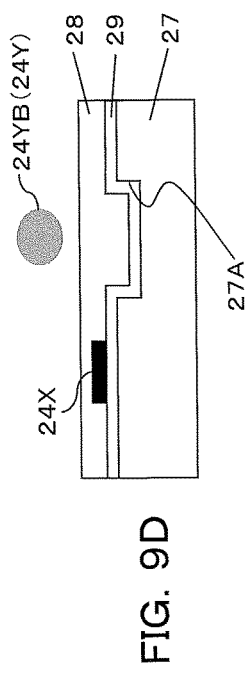

Further, the integrated circuit may be configured such that the lower insulating film 29 is provided on the semiconductor substrate 27 having the groove 27A and the bent line 24X is formed on the lower insulating film 29 and besides the upper insulating film 28 to cover the bent line 24X is provided as depicted in FIG. 9D. In particular, the integrated circuit may be configured such that the bent line 24X is formed on the lower insulating film 29, the upper insulating film 28 to cover the bent line 24X is provided, the shortcut line 24Y includes the wire 24YB, and the shortcut line 24Y (wire 24YB) is provided over the groove 27A provided on the semiconductor substrate 27. In this manner, the integrated circuit may be configured such that the lower insulating film 29 is provided on the semiconductor substrate 27, the bent line 24X is formed on the lower insulating film 29, the upper insulating film 28 to cover the bent line 24X is provided, and the thickness of the semiconductor substrate 27 is smaller at a portion thereof under the shortcut line 24Y (here, the wire 24YB) than at the other portion thereof.

Figure 10A:
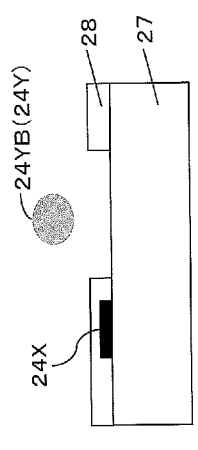

Further, where the upper insulating film 28 to cover the bent line 24X is provided, the thickness of the upper insulating film 28 may be smaller at a portion thereof under the shortcut line 24Y (here, the wire 24YB) than at the other portion thereof. For example, the upper insulating film 28 just under the shortcut line 24Y (here, the wire 24YB) may be removed in the form of a groove as depicted in FIG. 10A, or a groove (ditch) may be provided on the surface of the upper insulating film 28 just under the shortcut line 24Y (here, the wire 24YB).

Figure 10B:
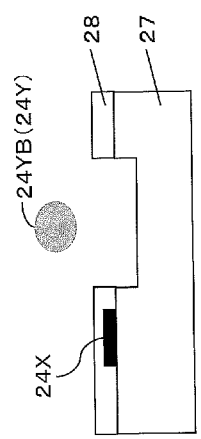

In this case, the thickness of the semiconductor substrate 27 may be smaller at a portion thereof under the shortcut line 24Y (here, the wire 24YB) than at the other portion thereof as depicted in FIG. 10B. Further, similarly as in the case described above, the lower insulating film 29 may be provided on the semiconductor substrate 27. Further, the thickness of the lower insulating film 29 may be smaller at a portion thereof under the shortcut line 24Y (here, the air bridge line 24YA) than at the other portion thereof. In particular, the lower insulating film 29 just under the shortcut line 24Y (here, the wire 24YB) may be removed in the form of a groove, or a groove (ditch) may be provided on the surface of the lower insulating film 29 just under the shortcut line 24Y (here, the wire 24YB).

Further, the shortcut line 24Y may be configured as a line provided on an insulating film in place of the configuration in which the shortcut line 24Y includes the air bridge line 24YA or the wire 24YB. In this case, the shortcut line 24Y may be formed from a multilayer line for which an interlayer insulating film is used.

Figure 11A:
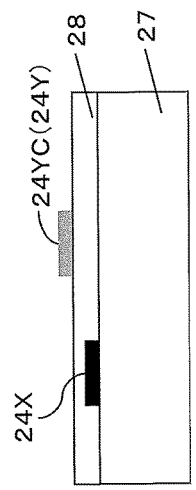

In particular, as depicted in FIG. 11A, the integrated circuit may be configured such that the bent line 24X is formed on the semiconductor substrate 27, the upper insulating film 28 to cover the bent line 24X is provided, and besides the shortcut line 24Y includes a portion 24YC formed on the upper insulating film 28. The shortcut line 24Y including the portion (line) 24YC formed on the upper insulating film 28 may be provided, for example, by covering the bent line 24X formed on the semiconductor substrate 27 with the upper insulating film 28 and coupling the line 24YC (metal line; conductor) with the bent line 24X through a via so as to short-cut the bent line 24X. Here, for the upper insulating film 28, for example, an SiN film, a polyimide film (organic insulating film) or the like is used. For example, a case in which an SiN film is provided as the upper insulating film 28, another case in which a polyimide film is provided as the upper insulating film 28, a further case in which an SiN film and a polyimide film are provided as the upper insulating film 28 and the like are available. In this case, while the bent line 24X is formed on the semiconductor substrate 27, the shortcut line 24Y is formed on the upper insulating film 28 having a lower relative dielectric constant than the semiconductor substrate 27. Therefore, the effective dielectric constant of the semiconductor substrate 27 is different from that of the bent line 24X, and the effective dielectric constant of the shortcut line 24Y can be made lower than that of the bent line 24X.

Figure 11B:
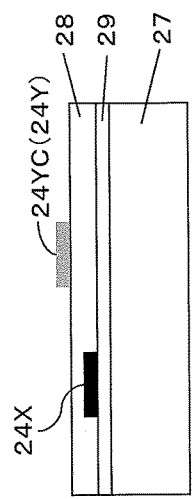

Further, the integrated circuit may be configured such that the lower insulating film 29 is provided on the semiconductor substrate 27 and the bent line 24X is formed on the lower insulating film 29 and besides the upper insulating film 28 to cover the bent line 24X is provided as depicted in FIG. 11B. In particular, the integrated circuit may be configured such that the bent line 24X is formed on the lower insulating film 29 and the upper insulating film 28 to cover the bent line 24X is provided and besides the shortcut line 24Y includes the portion 24YC formed on the upper insulating film 28.

Figure 11C:
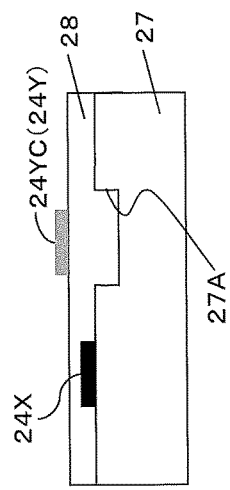

Further, as depicted in FIG. 11C, the thickness of the semiconductor substrate 27 may be smaller at a portion thereof under the shortcut line 24Y (here, the portion 24YC formed on the upper insulating film 28) than at the other portion thereof. For example, the groove 27A (ditch) may be provided on the surface of the semiconductor substrate 27 just under the shortcut line 24Y.

Figure 11D:
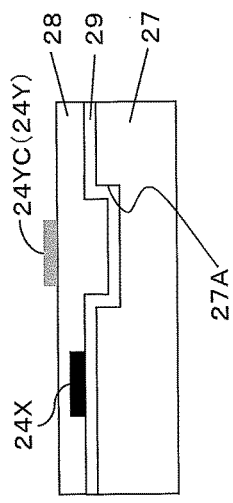

Further, the integrated circuit may be configured such that the lower insulating film 29 is provided on the semiconductor substrate 27 having the groove 27A and the bent line 24X is formed on the lower insulating film 29 and beside the upper insulating film 28 to cover the bent line 24X is provided as depicted in FIG. 11D. In particular, the integrated circuit may be configured such that the bent line 24X is formed on the lower insulating film 29, the upper insulating film 28 to cover the bent line 24X is provided, the shortcut line 24Y includes the portion 24YC formed on the upper insulating film 28, and the shortcut line 24Y (here, the portion 24YC formed on the upper insulating film 28) is provided over the groove 27A provided on the semiconductor substrate 27. In this manner, the integrated circuit may be configured such that the lower insulating film 29 is provided on the semiconductor substrate 27, the bent line 24X is formed on the lower insulating film 29, the upper insulating film 28 to cover the bent line 24X is provided, and the thickness of the semiconductor substrate 27 is smaller at a portion thereof under the shortcut line 24Y (here, the portion 24YC formed on the upper insulating film 28) than at the other portion thereof.

Accordingly, with the integrated circuit according to the present embodiment, there is an advantage that increase of the output power and increase of the efficiency can be implemented.

Figure 12A:
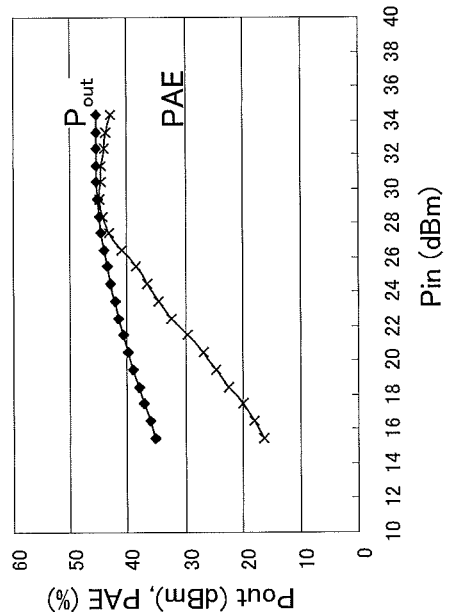
FIGS. 12A and 12B are views illustrating an effect by the integrated circuit according to the present embodiment.
Figure 12B:
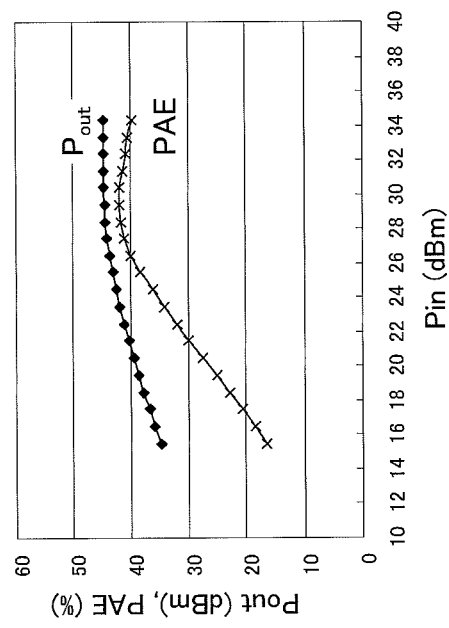

A prototype of an MMIC configured in such a manner as described above was produced, and the output power and the power added efficiency of the MMIC were measured and evaluated. As a result, it was confirmed that increased output power and increased efficiency were implemented successfully in comparison with those of a different MMIC that is not configured in such a manner as described above. In particular, in the case of the MMIC that does not have such a configuration as described above (refer to FIG. 4), the output power (Pout) was approximately 44.5 dBm and the power added efficiency (PAE) was approximately 41.8% as depicted in FIG. 12A. In contrast, in the case of the MMIC configured in such a manner as described hereinabove (refer to FIG. 1), the output power (Pout) was approximately 45.1 dBm and the power added efficiency (PAE) was approximately 44.7% as depicted in FIG. 12B. It is to be noted that reference character Pin denotes the input power. In particular, in the case of the MMIC configured in such a manner as described above (refer to FIG. 1), the output power indicates increase by approximately 15% and the power added efficiency indicates increase by approximately 3% in comparison with those in the case of the MMIC that does not have such a configuration as described above (refer to FIG. 4). In this manner, it was confirmed successfully that, in the case of the MMIC configured in such a manner as described above (refer to FIG. 1), increase of the output power and increase of the efficiency can be implemented in comparison with those in the case of the MMIC that does not have such a configuration as described above (refer to FIG. 4).

It is to be noted that, although, in the description of the embodiment given above, the integrated circuit is described taking an integrated circuit in which transistors and an impedance matching circuit are monolithically integrated as an example, the integrated circuit is not limited to this and may be a different integrated circuit in which transistors and an impedance patching circuit are hybrid-integrated. In particular, the integrated circuit may be configured such that transistors are hybrid-integrated on a matching circuit board having an impedance matching circuit thereon. For example, the integrated circuit may not be an MMIC chip but may be a hybrid IC chip (integrated circuit chip) wherein transistor chips are mounted on a matching circuit board that has an impedance matching circuit thereon. In this case, the matching circuit board having the impedance matching circuit thereon is configured, for example, from a multilayer alumina substrate (multilayer dielectric substrate; multilayer substrate) structured such that a plurality of alumina substrates (having a relative dielectric constant of approximately 9.9; dielectric substrate; insulating substrate) having lines (for example, gold lines) on the surface thereof. Therefore, the "semiconductor substrate" in the embodiment described hereinabove may be read as "dielectric substrate".

For example, the integrated circuit may be configured such that the bent line is formed on the dielectric substrate and the shortcut line includes an air bridge line or a wire. In this case, the upper insulating film to cover the bent line may be provided. Or, the shortcut line may be a line provided on an insulating film in place of the shortcut line that includes an air bridge line or a wire. In other words, the integrated circuit may be configured such that the bent line is formed on the dielectric substrate and the upper insulating film to cover the bent line is provided and besides the shortcut line includes a portion formed on the upper insulating film.

Incidentally, the integrated circuit configured in such a manner as in the embodiment described hereinabove can be incorporated in a transmission and reception apparatus (transmission and reception module). For example, the integrated circuit configured in such a manner as in the embodiment described hereinabove can be used in a transmission and reception apparatus that is provided in a base station of a portable telephone system and includes an amplifier or in a transmission and reception apparatus that is used in a radar and includes an amplifier.

Figure 13:
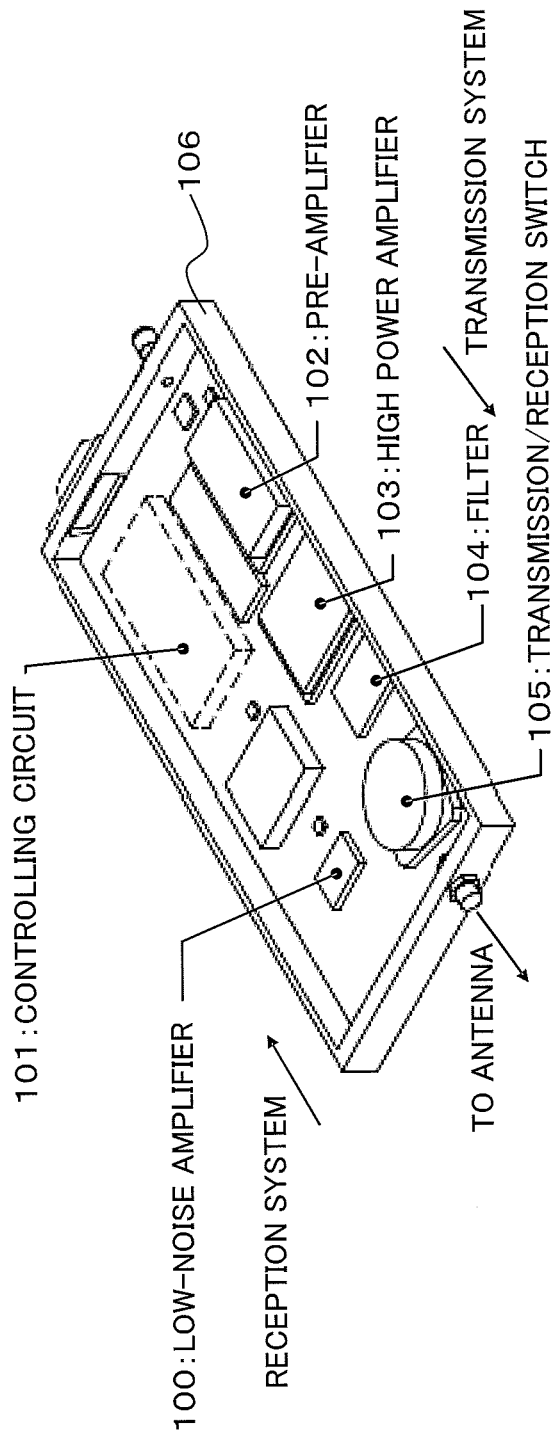
FIG. 13 is a schematic perspective view depicting a configuration of a transmission and reception apparatus according to the present embodiment.

The transmission and reception apparatus is configured, for example, in such a manner as depicted in FIG. 13. Referring to FIG. 13, the transmission and reception apparatus includes amplifiers and passive devices, for example, a low-noise amplifier 100, a controlling circuit 101, a pre-amplifier 102, a high power amplifier 103, a filter 104 and a transmission/reception switch 105 and so forth. The components are individually accommodated in packages separate from each other and mounted in a metal housing 106.

Of the components mentioned, the high power amplifier 103 may be configured so as to include an integrated circuit configured in such a manner as in the embodiment or the modification described above.

In this case, the transmission and reception apparatus includes an amplifier that includes an integrated circuit having transistors and an impedance matching circuit connected to the transistors. The impedance matching circuit includes a signal line to transmit a high-frequency signal, and a power supply line that is a short stub branched from the signal line and supplies current to the transistors. The power supply line includes a bent line, and a shortcut line to shortcut the bent line. Further, details of the configuration of the integrated circuit are similar to those in the case of the embodiment or the modification described above.

Accordingly, with the transmission and reception apparatus according to the present embodiment, there is an advantage that increase of the output power and increase of the efficiency can be implemented.

All examples and conditional language recited herein are intended for the pedagogical purposes of aiding the reader in understanding the disclosure and the concepts contributed by the inventor to further the art, and are not to be construed as limitations to such specifically recited examples and conditions, nor does the organization of such examples in the specification relate to a showing of the superiority and inferiority of the disclosure. Although one or more embodiments of the present disclosures have been described in detail, it should be understood that the various changes, substitutions, and alterations could be made hereto without departing from the spirit and scope of the disclosure.

What is claimed is:

1. An integrated circuit, comprising:
   a transistor; and
   an impedance matching circuit coupled with the transistor; wherein
   the impedance matching circuit includes a signal line to transmit a high-frequency signal and a power supply line that is a short stub branched from the signal line and supplies current to the transistor; and
   the power supply line includes a bent line and a shortcut line to shortcut the bent line, the shortcut line being a line to couple one portion and the other portion across a bent portion of the bent line.

2. The integrated circuit according to claim 1, wherein an effective permittivity of the shortcut line is lower than that of the bent line.

3. The integrated circuit according to claim 1, wherein the transistor and the impedance matching circuit are monolithically integrated.

4. The integrated circuit according to claim 2, wherein the bent line is formed on a semiconductor substrate or a lower insulating film, and
   the shortcut line includes an air bridge line.

5. The integrated circuit according to claim 2, wherein the bent line is formed on a semiconductor substrate or a lower insulating film, and
   the shortcut line includes a wire.

6. The integrated circuit according to claim 4, further comprising an upper insulating film to cover the bent line.

7. The integrated circuit according to claim 6, wherein a thickness of the upper insulating film is smaller than that of the other portion under the shortcut line.

8. The integrated circuit according to claim 2, wherein the bent line is formed on a semiconductor substrate or a lower insulating film;
   the integrated circuit further comprises an upper insulating film to cover the bent line; and
   the shortcut line includes a portion formed on the upper insulating film.

9. The integrated circuit according to claim 4, wherein a thickness of the semiconductor substrate is smaller than that of the other portion under the shortcut line.

10. The integrated circuit according to claim 1, wherein the transistor and the impedance matching circuit are hybrid-integrated.

11. The integrated circuit according to claim 2, wherein the bent line is formed on a dielectric substrate; and
    the shortcut line includes an air bridge line.

12. The integrated circuit according to claim 2, wherein the bent line is formed on a dielectric substrate; and
    the shortcut line includes a wire.

13. The integrated circuit according to claim 11, further comprising an upper insulating film to cover the bent line.

14. The integrated circuit according to claim 2, wherein the bent line is formed on a dielectric substrate;
    the integrated circuit further comprises an upper insulating film to cover the bent line; and
    the shortcut line includes a portion formed on the upper insulating film.

15. A transmission and reception apparatus, comprising:
    an amplifier that includes an integrated circuit including a transistor and an impedance matching circuit coupled with the transistor; wherein
    the impedance matching circuit includes a signal line to transmit a high-frequency signal and a power supply line that is a short stub branched from the signal line and supplies current to the transistor; and
    the power supply line includes a bent line and a shortcut line to shortcut the bent line, the shortcut line being a line to couple one portion and the other portion across a bent portion of the bent line.

16. The transmission and reception apparatus according to claim 15, wherein an effective permittivity of the shortcut line is lower than that of the bent line.

17. The transmission and reception apparatus according to claim 15, wherein the bent line is formed on a semiconductor substrate, a lower insulating film or a dielectric substrate; and
    the shortcut line includes an air bridge line.

18. The transmission and reception apparatus according to claim 15, wherein the bent line is formed on a semiconductor substrate, a lower insulating film or a dielectric substrate; and
    the shortcut line includes a wire.

19. The transmission and reception apparatus according to claim 17, further comprising an upper insulating film to cover the bent line.

20. The transmission and reception apparatus according to claim 15, wherein the bent line is formed on a semiconductor substrate, a lower insulating film or a dielectric substrate;
    the transmission and reception apparatus further comprises an upper insulating film to cover the bent line; and
    the shortcut line includes a portion formed on the upper insulating film.

* * * * *